United States Patent
Dickmann

(10) Patent No.: US 7,471,756 B2
(45) Date of Patent: Dec. 30, 2008

(54) PHASE DETECTOR AND METHOD FOR A SHORTENING PHASE-ERROR-CORRECTION PULSE

(75) Inventor: Mark William Dickmann, Bellevue, WA (US)

(73) Assignee: Intersil Americas Inc., Milpitas, CA (US)

( * ) Notice: Subject to any disclaimer, the term of this patent is extended or adjusted under 35 U.S.C. 154(b) by 839 days.

(21) Appl. No.: 10/371,183

(22) Filed: Feb. 21, 2003

(65) Prior Publication Data

US 2003/0185329 A1   Oct. 2, 2003

Related U.S. Application Data

(60) Provisional application No. 60/359,270, filed on Feb. 21, 2002.

(51) Int. Cl.
*H03D 3/24* (2006.01)
*H03K 5/08* (2006.01)

(52) U.S. Cl. ......................... 375/376; 327/312

(58) Field of Classification Search .................. 375/327, 375/294, 376; 327/312, 147, 156; 329/325, 329/360; 455/180.3
See application file for complete search history.

(56) References Cited

U.S. PATENT DOCUMENTS

| | | | | |
|---|---|---|---|---|
| 5,953,386 A | * | 9/1999 | Anderson | 375/376 |
| 6,362,670 B1 | * | 3/2002 | Beaulieu | 327/156 |
| 2001/0043086 A1 | * | 11/2001 | Idei et al. | 327/12 |
| 2002/0085658 A1 | * | 7/2002 | Boerstler | 375/376 |
| 2003/0103582 A1 | * | 6/2003 | Linsky et al. | 375/327 |
| 2003/0185329 A1 | * | 10/2003 | Dickmann | 375/375 |
| 2004/0062336 A1 | * | 4/2004 | Kuwata et al. | 375/376 |

OTHER PUBLICATIONS

Jan Craninckx, et al., "A Fully Integrated CMOS DCS-1800 Frequency Synthesizer", IEEE Journal of Solid-State Circuits, vol. 33, No. 12, Dec. 1998, pp. 2054-2065.
Cicero Vaucher, et al. "A Wide-Band Tuning System for Fully Integrated Satellite Receivers", IEEE Journal of Solid-State Circuits, vol. 33, No. 7, Jul. 1998, pp. 987-997.
Kurt M. Ware, et al., "A 200-MHz CMOS Phase-Locked Loop with Dual Phase Detectors", IEEE Journal of Solid-State Circuits, vol. 24, No. 6, Dec. 1989, pp. 1560-1568.

* cited by examiner

*Primary Examiner*—Khai Tran
(74) *Attorney, Agent, or Firm*—Paul A. Bernkopf; Graybeal Jackson LLP

(57) ABSTRACT

In a phase-locked loop (PLL), a phase detector receives a reference signal and a feedback oscillator signal, generates a phase-detect pulse having a first duration in response to one of the reference and feedback signals, and generates a phase-correction pulse having second, shorter duration in response to the phase-detect pulse. By shortening the phase-correction pulse, such a phase detector can reduce or eliminate the overcorrection period during which the phase-correction pulse is active after phase correction is achieved, and thus can reduce or eliminate the phase error that the overcorrection period may introduce into a PLL's oscillator signal.

32 Claims, 9 Drawing Sheets

PHASE DETECTOR AND METHOD FOR A SHORTENING PHASE-ERROR-CORRECTION PULSE

CROSS-REFERENCE TO RELATED APPLICATIONS

This application claims priority to U.S. Provisional Application Ser. No. 60/359,270, filed on Feb. 21, 2002, which is incorporated by reference.

BACKGROUND OF THE INVENTION

Phase-locked loops (PLLs) perform functions that are critical to many of today's electronic circuits. For example, a PLL can generate one or more output signals, hereinafter oscillator signals, that are phase locked to a reference signal, and thus have frequencies that are precise multiples of the reference signal's frequency. One can use such a PLL oscillator signal to clock digital circuits or to modulate/demodulate data signals in an electronic system.

Unfortunately, the higher the data rate of a signal that modulates a PLL oscillator signal, the more sensitive the modulated signal is to noise. That is, for a given level of noise, the Signal-to-Noise Ratio (SNR) of the modulated signal decreases as the data rate of the modulating signal increases.

FIG. 1 is a block diagram of conventional PLL 10 that, when operating in a locked mode, generates two oscillator signals OSC1 and OSC2 that are phase locked to a reference signal REF. The PLL 10 includes a phase detector 12 for detecting a difference $\Delta\phi$ between the phases of REF and a feedback oscillator signal and for generating a phase-correction pulse having a duration that is related to the phase difference $\Delta\phi$. A control circuit 14 filters the phase-correction pulse and generates a control signal from the filtered phase-correction pulse, and a signal-controlled oscillator, here a voltage-controlled oscillator (VCO) 16, generates OSC1 having a frequency that is steered by the control signal. When the feedback signal is locked to REF—that is, the feedback signal is in phase with REF such that $\Delta\phi=0$—the VCO 16 generates OSC1 having a frequency of F×T, where F is the frequency of REF. A forward frequency divider 18 generates OSC2 by frequency dividing OSC1 by M, and a feedback frequency divider 20 generates the feedback signal by frequency dividing OSC2 by N=T/M. Consequently, when the feedback signal is phase locked to REF, OSC2 has a frequency of F×T/M, and the feedback signal has the same frequency, F, as REF.

During a locked mode of operation, the PLL 10 phase locks OSC1 and OSC2 to REF by using negative feedback to maintain the phase difference $\Delta\phi$ between REF and the feedback oscillator signal at or near zero. For example, assume that during one cycle the feedback signal lags REF such that $\Delta\phi$ is negative. Therefore, to close the phase gap, the PLL 10 increases the frequency of the feedback signal by increasing the frequency of OSC1. Specifically, the phase detector 12 generates a phase-correction pulse that indicates that the feedback signal lags REF. In response to the phase-correction pulse, the control circuit 14 speeds up the VCO 16 to increase the frequencies of OSC1 and OSC2, and to thus increases the frequency of the feedback signal. When the frequency of the feedback signal increases to the point where the feedback signal is in phase with REF, the phase-correction pulse indicates that $\Delta\phi=0$ (no correction is necessary) such that the control circuit 14 maintains the feedback signal at the in-phase frequency. If the feedback signal leads REF such that $\Delta\phi$ is positive, the PLL 10 decreases the frequency of the feedback signal. Specifically, the phase detector 12 generates the phase-correction pulse to indicate that the feedback signal leads REF. In response to the phase-correction pulse, the control circuit 14 slows down the VCO 16 to decrease the frequencies of OSC1 and OSC2, and to thus decrease the frequency of the feedback signal. When the frequency of the feedback signal decreases to the point where the feedback signal is in phase with REF, the phase-correction pulse indicates that $\Delta\phi=0$ (no correction is necessary) such that the control circuit 14 maintains the feedback signal at the in-phase frequency.

Unfortunately, as discussed above and as discussed below in conjunction with FIGS. 2-4, the inventor has discovered that noise generated by the control circuit 14, an imbalance in the control circuit, or both control-circuit noise and imbalance, may introduce a phase error into OSC1 and OSC2, and this phase error may reduce the SNR of a modulated data signal that includes OSC1 or OSC2 as a carrier component or of a data signal that is demodulated by OSC1 or OSC2.

FIG. 2 is a schematic diagram of the phase detector 12 and the control circuit 14 of FIG. 1.

The phase detector 12 includes a phase-detect circuit 30 and a reset circuit 32. The phase-detect circuit 30 includes a pair of D flip-flops 34 and 36 for detecting the phase difference $\Delta\phi$ between the feedback signal and REF, for generating oscillator-frequency-UP and oscillator-frequency-DOWN phase-detect pulses in response to the detected $\Delta\phi$, and for providing these phase—detect pulses to the control circuit 14 as the phase—correction pulses. Specifically, in response to REF transitioning from a logic 0 to a logic 1, the flip-flop 34 generates a logic 1 for UP. Likewise, in response to the feedback signal transitioning from a logic 0 to a logic 1, the flip-flop 36 generates a logic 1 for DOWN. Consequently, if UP transitions to logic 1 before DOWN transitions to logic 1, the feedback signal lags REF by a phase difference $\Delta\phi_{lag}$ that is proportional to the time difference between the logic-1 transitions of UP and DOWN. Conversely, if UP transitions to logic 1 after DOWN, the feedback signal leads REF by a phase difference $\Delta\phi_{lead}$ that is proportional to the time difference between the logic-1 transitions of UP and DOWN. Moreover, if UP and DOWN transition to logic 1 at the same time, the feedback signal is in phase with REF, i.e., $\Delta\phi=0$, for that cycle. The reset circuit 32 includes an AND gate 38 that generates a RESET signal for resetting the flip-flops 34 and 36 after the lagging one of the pulses UP and DOWN transitions to a logic 1. The reset flip-flops 34 and 36 are then ready for the next logic-1-to-logic-0 transitions of REF and the feedback signal.

The control circuit 14 includes a charge pump 40 that generates a control voltage CV across a capacitor 42 in response to the UP and DOWN phase-detect pulses from the phase detector 12. The VCO 16 (FIG. 1) is designed such that the frequency of OSC1 is proportional to CV. Therefore, as CV increases, the frequency of OSC1 increases, and as CV decreases, the frequency of OSC1 decreases. Consequently, in response to the UP pulse (the feedback signal lags REF), the charge pump 40 generates a charge current $I_{up}$ to increase CV, and in response to the DOWN pulse (the feedback signal leads REF), the pump generates a discharge current $I_{down}$ to reduce CV.

FIGS. 3 and 4 are timing diagrams of the following signals in FIGS. 1 and 2 when the PLL 10 is operating in a locked mode: RESET, REF, the feedback signal, DOWN, and UP. Specifically, FIG. 3 is a timing diagram of these signals when the feedback signal is in phase with REF ($\Delta\phi=0$), and FIG. 4 is a timing diagram of these signals when the feedback signal leads REF by $\Delta\phi_{lead}\approx1$ nanosecond (ns).

Referring to FIGS. 2 and 3, even when the feedback signal is in phase with REF, the phase-detect circuit 30 generates both UP and DOWN having active logic-1 levels during an "overcorrection" period. At time t0, both REF and the feedback signal transition to a logic 1, and thus are in phase with one another. Therefore, one might expect that the phase-detect circuit 30 would not transition UP or DOWN to an active logic 1 because no phase correction is needed. But because of delays inherent in the phase-detect and reset circuits 30 and 32, this is not the case. At time t1, both UP and DOWN transition to logic 1, where the delay—here approximately 1 ns—between t0 and t1 is due to the respective clocking-propagation delays through the flip-flops 34 and 36. Because the flip-flops 34 and 36 are typically on the same area of the chip (not shown) that incorporates them, it is accurate to assume that their delays are equal or approximately equal. At time t2, RESET transitions to an active logic 1, where the delay—here approximately 0.1 ns—between t1 and t2 is the output-logic-0-to-logic-1 propagation delay through the AND gate 38. At time t3, UP and DOWN transition back to an inactive logic 0, where the delay—here approximately 0.7 ns—between t2 and t3 is the clearing-propagation delay through the flip-flops 34 and 36. The period between t1 and t3—here approximately 0.8 ns—is the overcorrection period, which is the nonzero, and ideally unnecessary, period that UP and DOWN are active after no further phase correction of the feedback signal is necessary. Although the flip-flops 34 may have different clearing-propagation delays that may cause mismatched overcorrection periods by causing UP and DOWN to transition to logic 0 at different times, such a mismatch is typically so small that it can be ignored. At time t4, RESET transitions back to an inactive logic 0, where the delay—here approximately 0.3 ns—between t3 and t4 is the output-logic-1-to-logic-0 propagation delay through the AND gate 38.

Still referring to FIGS. 2 and 3, the inventor has discovered that the overcorrection period may cause the charge pump 40 to introduce a phase error into OSC1 and OSC2. When both UP and DOWN are active the charge pump 40 simultaneously generates both $I_{up}$ and $I_{down}$. Ideally, the charge pump 40 is balanced ($I_{up}=I_{down}$) such that when both UP and DOWN are active, the net current to the capacitor 42 is zero, CV remains unchanged, and thus the phases of OSC1 and OSC2 remain unchanged. But manufacturing variations in the circuitry of the control circuit 14 may cause the pump 40 to be unbalanced ($I_{up}=I_{down}$). Consequently, the unbalanced pump 40 may erroneously change CV, and thus the phases of OSC1 and OSC2, during the overcorrection period. Furthermore, the charge pump 40 typically generates noise when it is active, and this noise may cause an erroneous shift in the phases of OSC1 and OSC2 independently of any shift that a pump imbalance may cause. In both the imbalance and noise cases, however, the phase error that the pump 40 introduces to OSC1 and OSC2 is proportional to the length of the overcorrection period. That is, the longer the overcorrection period, the greater the phase error that the charge pump 40 typically introduces to OSC1 and OSC2.

Referring to FIGS. 2 and 4, the overcorrection period, and the corresponding phase error that the charge pump 40 may introduce, are also present when REF and the feedback signal are out of phase. At time t0 the leading feedback signal transitions to a logic 1, and thus triggers a true phase-correction cycle. At time t1 the flip-flop 36 transitions DOWN to logic 1 in response to the feedback signal's transition, and REF transitions to logic 1. One might expect that the phase-detect circuit 30 would transition DOWN back to logic 0 and not transition UP to an active logic 1 because no further phase correction is needed. But because of the above-described delays inherent in the phase-detect and reset circuits 30 and 32, this is not the case. At time t2, the flip-flop 34 transitions UP to logic 1 in response to REF's transition, and, at time t3, the AND gate 38 transitions RESET to an active logic 1 in response to the transition of UP. At time t4, UP and DOWN transition back to an inactive logic 0 such that the overcorrection period between t2 and t4 is approximately 0.8 ns, the same duration as discussed above in conjunction with FIG. 3 where the feedback signal is in phase with REF. Consequently, the overcorrection period, which here extends the length of DOWN beyond that which is necessary to correct the phase of the feedback signal, may cause the charge pump 40 to introduce a noticeable phase error into OSC1 and OSC2 as discussed above. At time t5, the AND gate 38 transitions RESET back to an inactive logic 0 to end the phase-correction cycle.

SUMMARY OF THE INVENTION

In one embodiment of the invention, a phase detector receives a reference signal and a feedback oscillator signal, generates a phase-detect pulse having a first duration in response to one of the reference and feedback signals, and generates a phase-correction pulse having second, shorter duration than the phase-detect pulse.

By shortening the phase-correction pulses, such a phase detector can reduce or eliminate the overcorrection period during which the phase-correction pulse is active after phase correction is achieved, and thus can reduce or eliminate the phase error that the overcorrection period may introduce into a PLL's oscillator signal. And because reducing or eliminating the phase error reduces the noise introduced into a signal modulated or demodulated by the oscillator signal, the phase detector may reduce the SNR of such a signal less than a conventional phase detector might.

DESCRIPTION OF THE PREFERRED EMBODIMENTS

The following discussion is presented to enable a person skilled in the art to make and use the invention. Various modifications to the embodiments will be readily apparent to those skilled in the art, and the generic-principles herein may be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein.

Figure 1:
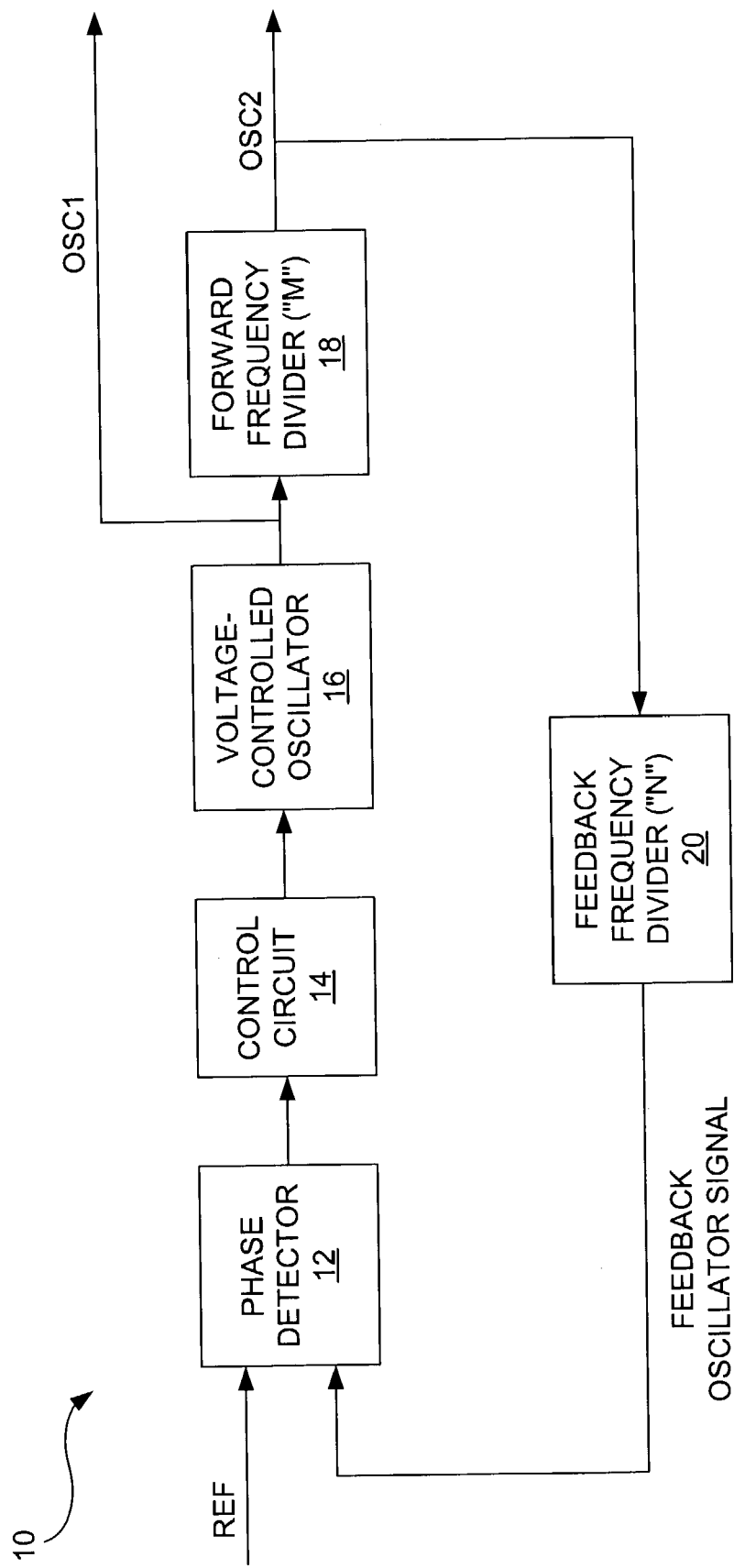
FIG. 1 is a block diagram of conventional phase-locked loop.
Figure 2:
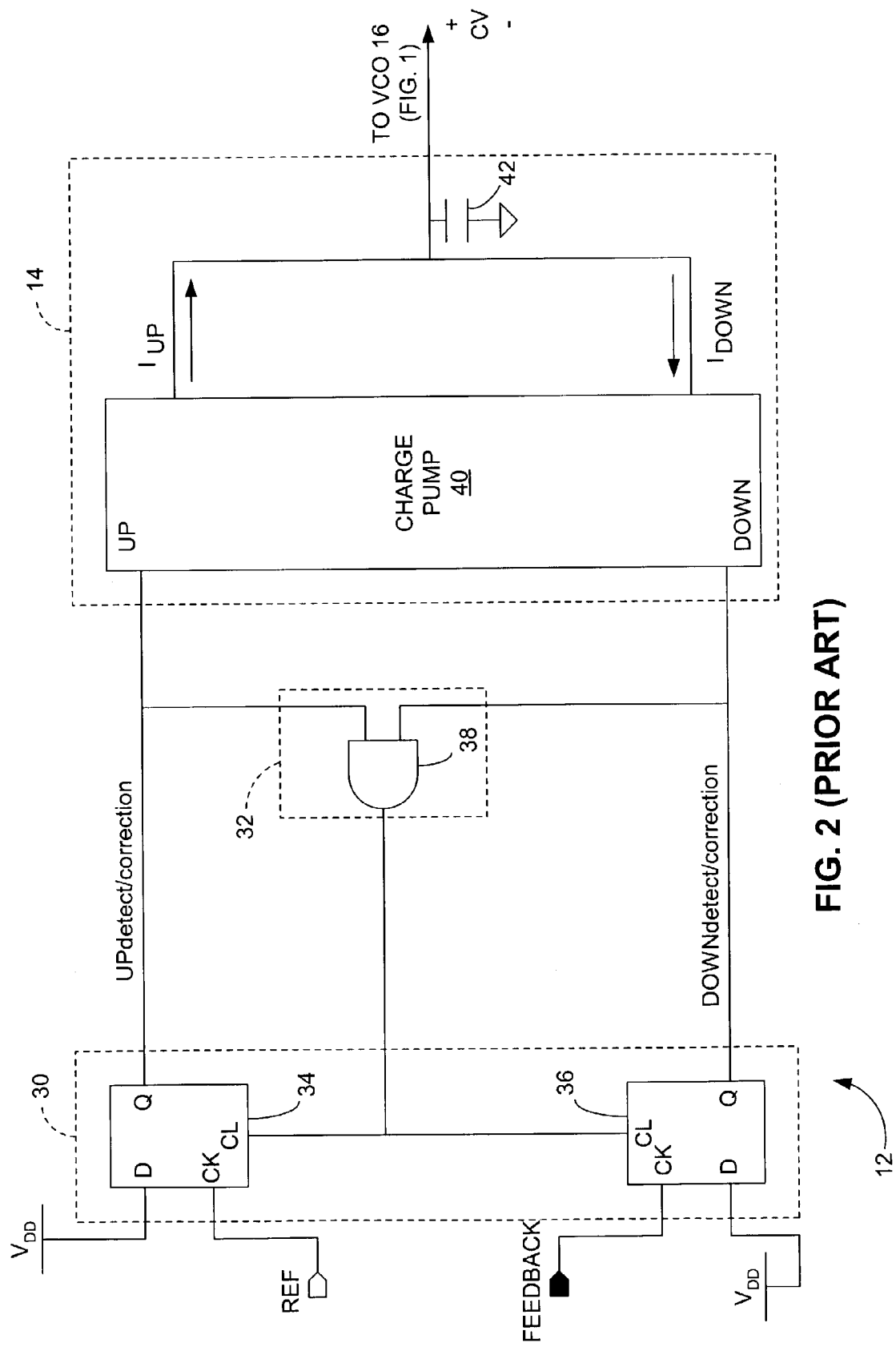
FIG. 2 is a schematic diagram of the phase detector of FIG. 1.
Figure 3:
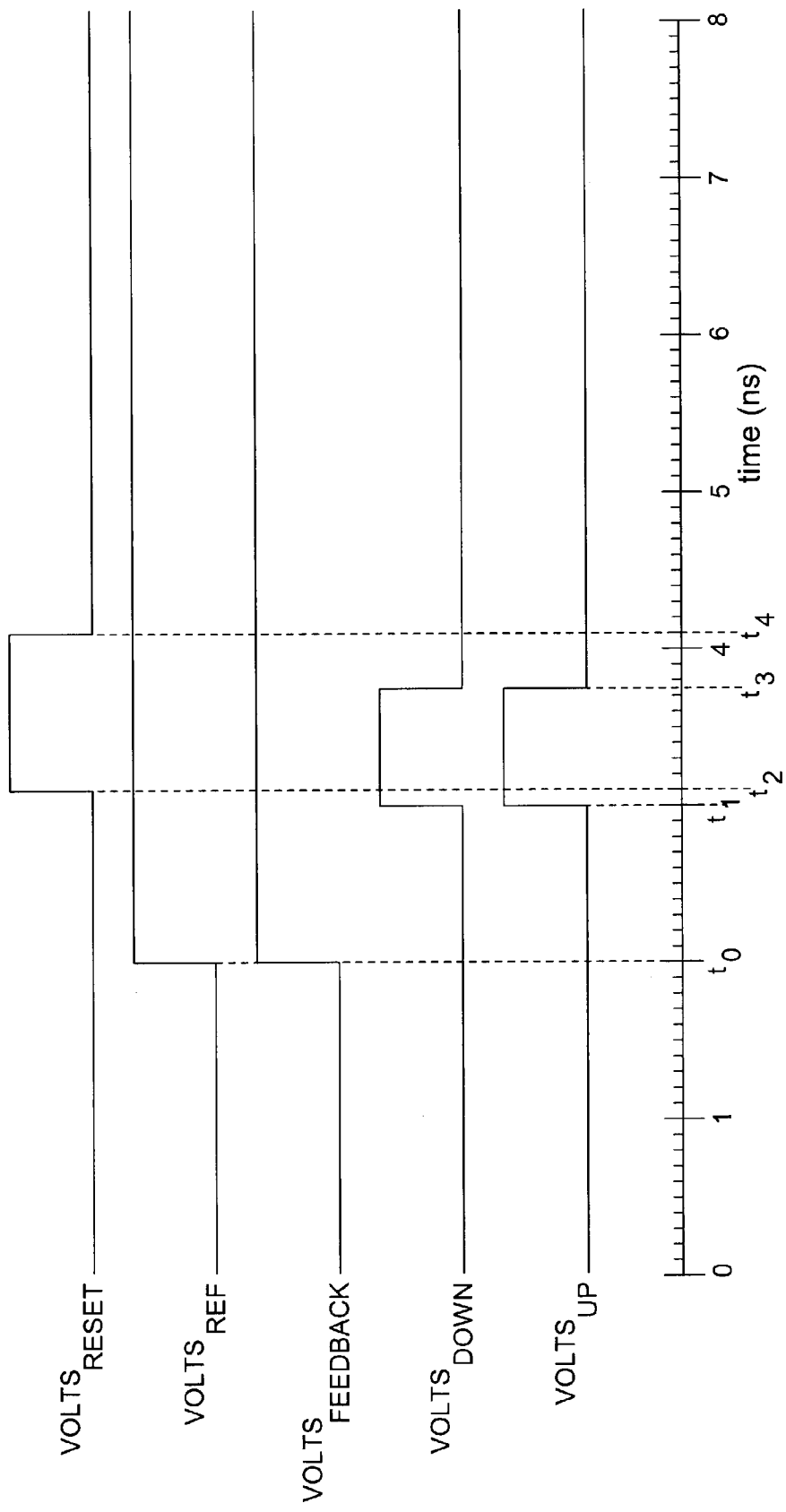
FIG. 3 is a timing diagram of the signals generated by the phase detector of FIG. 2 when the feedback and reference signals are in phase.
Figure 5:
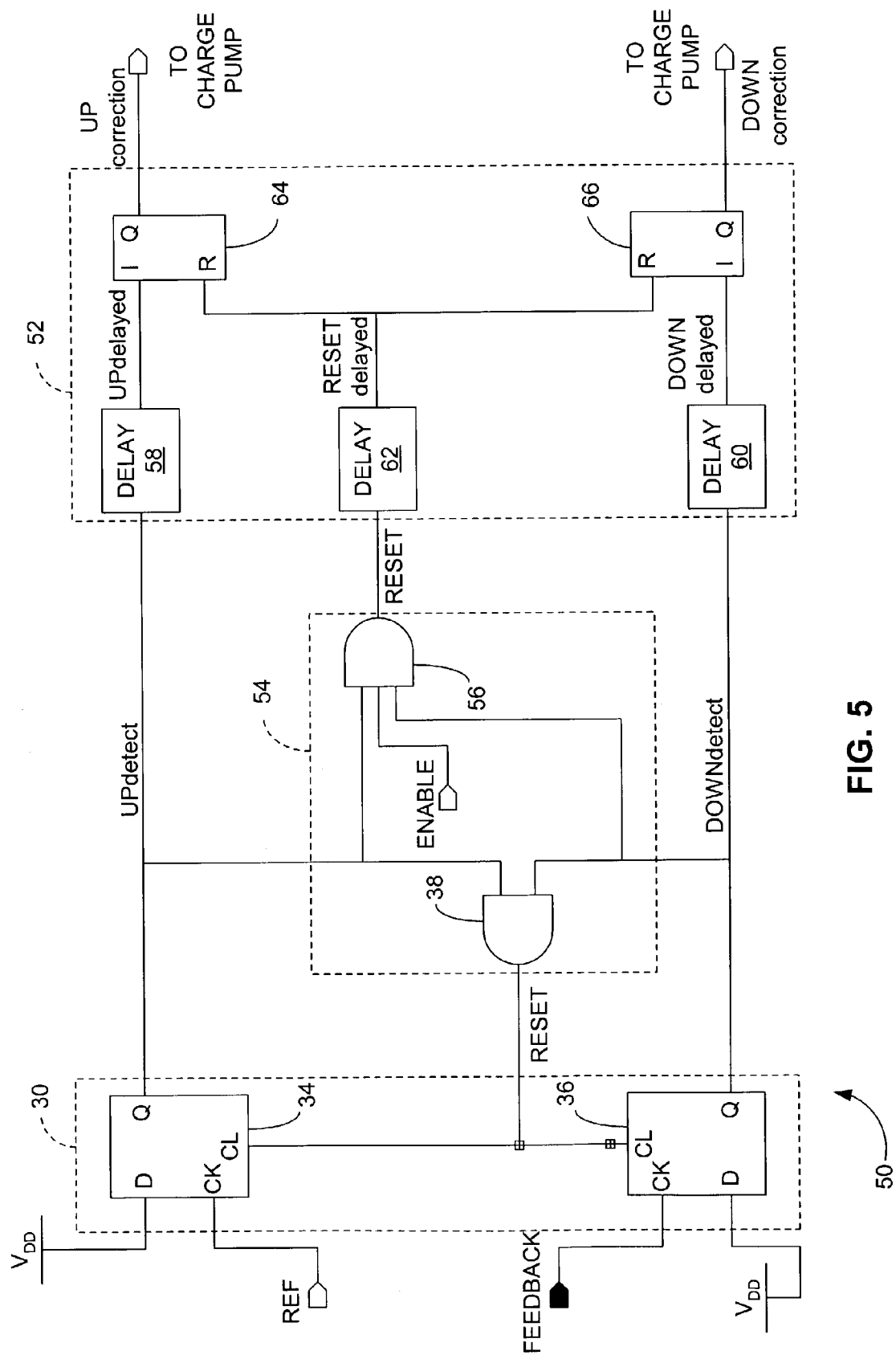
FIG. 5 is a schematic diagram of a phase detector according to an embodiment of the invention.

FIG. 5 is schematic diagram of a phase detector 50 that can generate phase-correction pulses $UP_{correction}$ and $DOWN_{correction}$ each having a shortened overcorrection period according to an embodiment of the invention, where like numerals are used in FIGS. 2 and 5 for like components. The phase detector 50 can replace the phase detector 12 of FIGS. 1 and 2, and is similar to the phase detector 12 except that it includes a feed-forward phase-correction circuit 52 that can reduce the overcorrection periods of the phase-correction pulses, and thus can reduce the phase error that the charge pump 40 may introduce into OSC1 and OSC2 (FIG. 2). Of course, the phase detector 50 can also be used to reduce overcorrection-induced phase error in PLLs other than the PLL 10 of FIG. 1.

In addition to the phase-correction circuit 52, the phase detector 50 includes the phase-detect circuit 30 and a modified reset circuit 54, which includes the AND gate 38 and a three-input AND gate 56 for generating the RESET signal for the circuit 52. Although the AND gate 56 can be omitted such that the AND gate 38 generates RESET for both the phase-detect and feed-forward circuits 30 and 52, the AND gate 56 allows one to disable the circuit 52 from shortening the overcorrect periods of $UP_{correction}$ and $DOWN_{correction}$.

The phase-correction circuit 52 generates phase-correction pulses $UP_{correction}$ and $DOWN_{correction}$ from phase-detect pulses $UP_{detect}$ and $DOWN_{detect}$, where $UP_{correction}$ and $DOWN_{correction}$ have shorter overcorrection periods than $UP_{detect}$ and $DOWN_{detect}$. The circuit 52 includes UP and DOWN delay circuits 58 and 60, RESET delay circuit 62, and UP and DOWN output gates 64 and 66. The circuits 58 and 60 typically impart the same or approximately the same delay to the phase-detect pulses $UP_{detect}$ and $DOWN_{detect}$ to generate intermediate signals $UP_{delayed}$ and $DOWN_{delayed}$ at the input terminals I of the gates 64 and 66. Similarly, the circuit 62 imparts a delay to the RESET signal from the AND gate 56 to generate an intermediate signal $RESET_{delayed}$ at the reset terminals R of the gates 64 and 66. When $RESET_{delayed}$ equals an inactive logic 0, the gates 64 and 66 generate the phase-correction pulses $UP_{correction}$ and $DOWN_{correction}$ equal to $UP_{delayed}$ and $DOWN_{delayed}$. But when $RESET_{delayed}$ equals an active logic 1, the gates 64 and 66 generate $UP_{correction}$ and $DOWN_{correction}$ equal to inactive logic 0. Consequently, as discussed below in conjunction with FIG. 6, by adjusting the delays of the circuits 58, 60, and 62, one can reduce or eliminate the overcorrection periods of $UP_{correction}$ and $DOWN_{correction}$. Furthermore, although the circuits 58 and 60 add a delay to the feedback loop of the PLL that includes the phase detector 50, this delay is typically too small to significantly affect the stability of the PLL.

Figure 6:
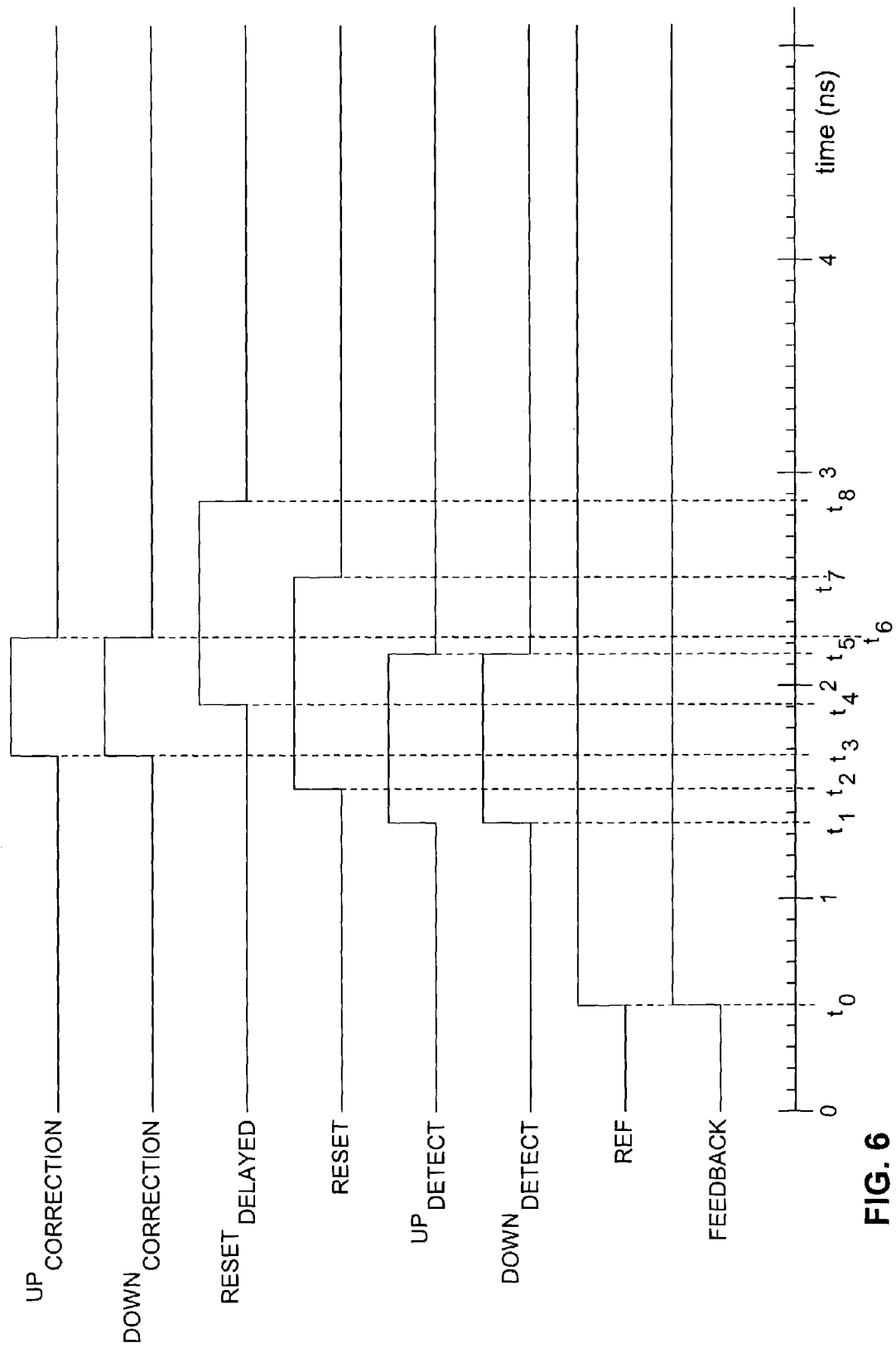
FIG. 6 is a timing diagram for some of the signals generated by the phase detector of FIG. 5 according to an embodiment of the invention.

FIG. 6 is a timing diagram of the following signals in FIG. 5 where the feedback oscillator signal 13 is in phase with REF: $UP_{correction}$, $DOWN_{correction}$, $RESET_{delayed}$, RESET, $UP_{detect}$, $DOWN_{detect}$, REF, and the feedback signal.

Figure 4:
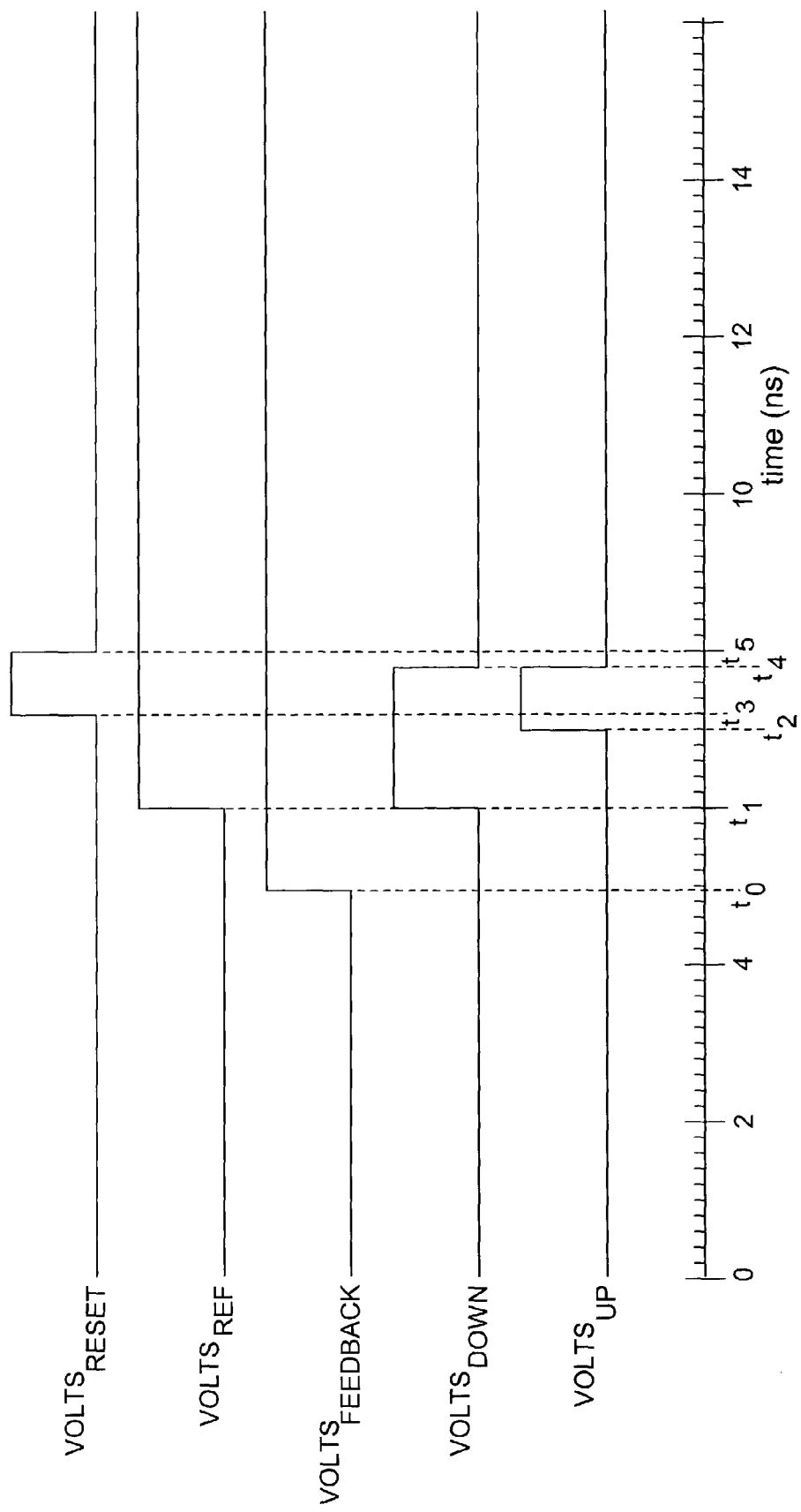
FIG. 4 is a timing diagram of the signals generated by the phase detector of FIG. 2 when the feedback and reference signals are out of phase.

Referring to FIGS. 5 and 6, in one embodiment, the phase detector 50 can reduce the overcorrection periods from the approximately 0.8 ns shown in FIGS. 2 and 4 to approximately 0.5 ns. In this embodiment, the phase detector 50 is installed in the PLL 10 of FIG. 1, the PLL is operating in the locked mode, the delays of the circuits 56 and 60 are or are approximately 0.2 ns, the delay of the circuit 62 is or is approximately 0.4 ns, the I-to-Q delays of the gates 64 and 66 are or are approximately 0.2 ns, and the reset delays of the gates 64 and 66 are or are approximately 0.3 ns.

Referring to FIGS. 5 and 6, at time t0, both REF and the feedback signal transition to a logic 1, and are thus in phase. At time t1, the flip-flops 34 and 36 transition $UP_{detect}$ and $DOWN_{detect}$ to active logic 1, and, at time t2, the AND gates 38 and 56 transition RESET to an active logic 1. At time t3, the gates 64 and 66 transition $UP_{correction}$ and $DOWN_{correction}$ to active logic 1, thus causing the charge pump 40 (FIG. 2) to generate both $I_{up}$ and $I_{down}$. At time t4, the delay circuit 62 transitions $RESET_{delay}$ to an active logic 1, and at time t5, the flip-flops 34 and 36 transition $UP_{detect}$ and $DOWN_{detect}$ back to inactive logic 0 in response to RESET. Similarly, at time t6, the gates 64 and 66 transition $UP_{correction}$ and $DOWN_{correction}$ back to inactive logic 0 in response to $RESET_{delayed}$. Consequently, the overcorrection periods of $UP_{correction}$ and $DOWN_{correction}$ (t6−t3=0.5 ns) are significantly shortened as compared to the overcorrection periods of $UP_{detect}$ and $DOWN_{detect}$ (t5−t1=0.8 ns). At times t7 and t8, the reset circuit 54 and the delay circuit 62 transition RESET and $RESET_{delayed}$ transition back to inactive logic 0.

Although not shown in FIG. 6, the overcorrection periods of $UP_{correction}$ and $DOWN_{correction}$ also have the same duration of 0.5 ns when the feedback signal leads or lags REF for reasons similar to those discussed above in conjunction with FIG. 4.

Still referring to FIGS. 5 and 6 and as stated above, by varying the delay values of the delay circuits 56, 60, and 62, one can set the durations of the overcorrection periods of $UP_{correction}$ and $DOWN_{correction}$ to desired values. Although one can set the durations of the overcorrection periods to zero, in one embodiment of the invention the minimum durations of the overcorrection periods is equal to the turn-on time of the charge pump 40 (FIG. 2). Otherwise, OSC1 and OSC2 (FIG. 1) may have a phase-error that "floats" until it is large enough to generate $UP_{correction}$ or $DOWN_{correction}$ long enough to turn on the charge pump 40.

Figure 7:
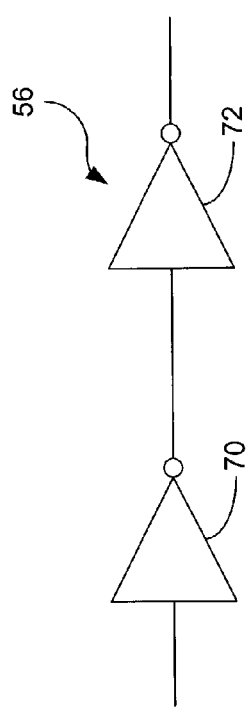
FIG. 7 is a schematic diagram of the UP and DOWN delay circuits of FIG. 5 according to an embodiment of the invention.

FIG. 7 is a schematic diagram of the UP delay circuit 56 of FIG. 5 according to an embodiment of the invention, it being understood that the DOWN delay circuit 60 can be the same. The delay circuit 56 includes two serially connected inverters 70 and 72 that each have a propagation delay of approximately 0.1 ns.

Figure 8:
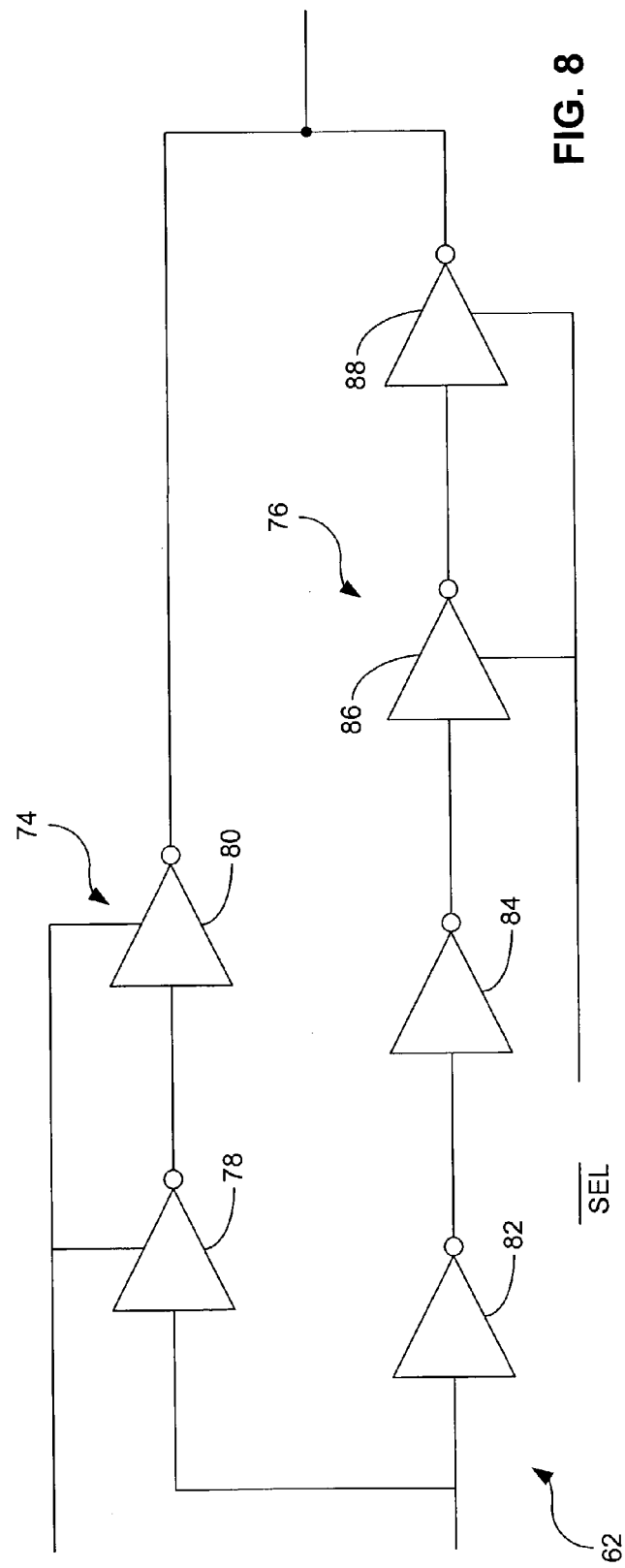
FIG. 8 is a schematic diagram of the RESET delay circuit of FIG. 5 according to an embodiment of the invention.

FIG. 8 is a schematic diagram of the RESET delay circuit 62 of FIG. 5 according to an embodiment of the invention. The circuit 62 has a short delay path 74 that has a delay of 0.2 ns and that is operational when a selection signal SEL equals a logic 1, and has a long delay path 76 that has a delay of 0.4 ns and that is operational when SEL equals a logic 0. The short delay path 74 includes two serially connected inverters 78 and 80, and the long delay path 76 includes four serially connected inverters 82, 84, 86, and 88, where each of the inverters has a propagation delay of 0.1 ns. The long delay path 76 provides 0.5 ns overcorrect periods for $UP_{correction}$ and $DOWN_{correction}$ as shown in FIG. 6, and the short delay path 74 provides a 0.3 ns overcorrection period.

Figure 9:
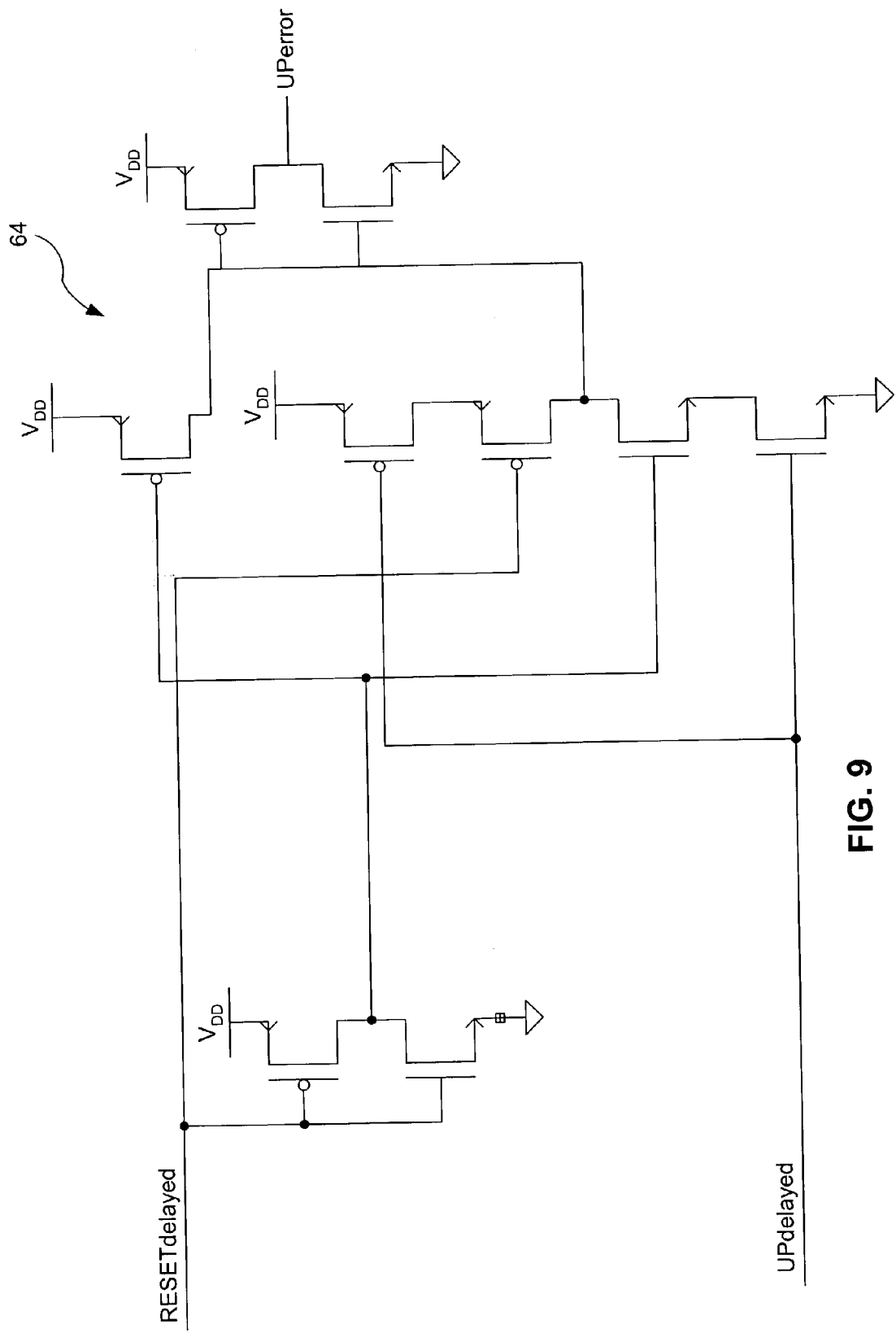
FIG. 9 is a schematic diagram of the output gates of FIG. 5 according to an embodiment of the invention.

FIG. 9 is a schematic diagram of the gate 64 of FIG. 5 according to an embodiment of the invention, it being understood that the gate 66 can be the same. As discussed above in conjunction with FIG. 5, when $RESET_{delayed}$ equals logic 0, $UP_{correction}=UP_{delayed}$ (after a propagation delay) But when $RESET_{delayed}$ equals logic 1, $UP_{correction}$ equals logic 0 (after a propagation delay) regardless of the value of $UP_{delayed}$.

Figure 10:
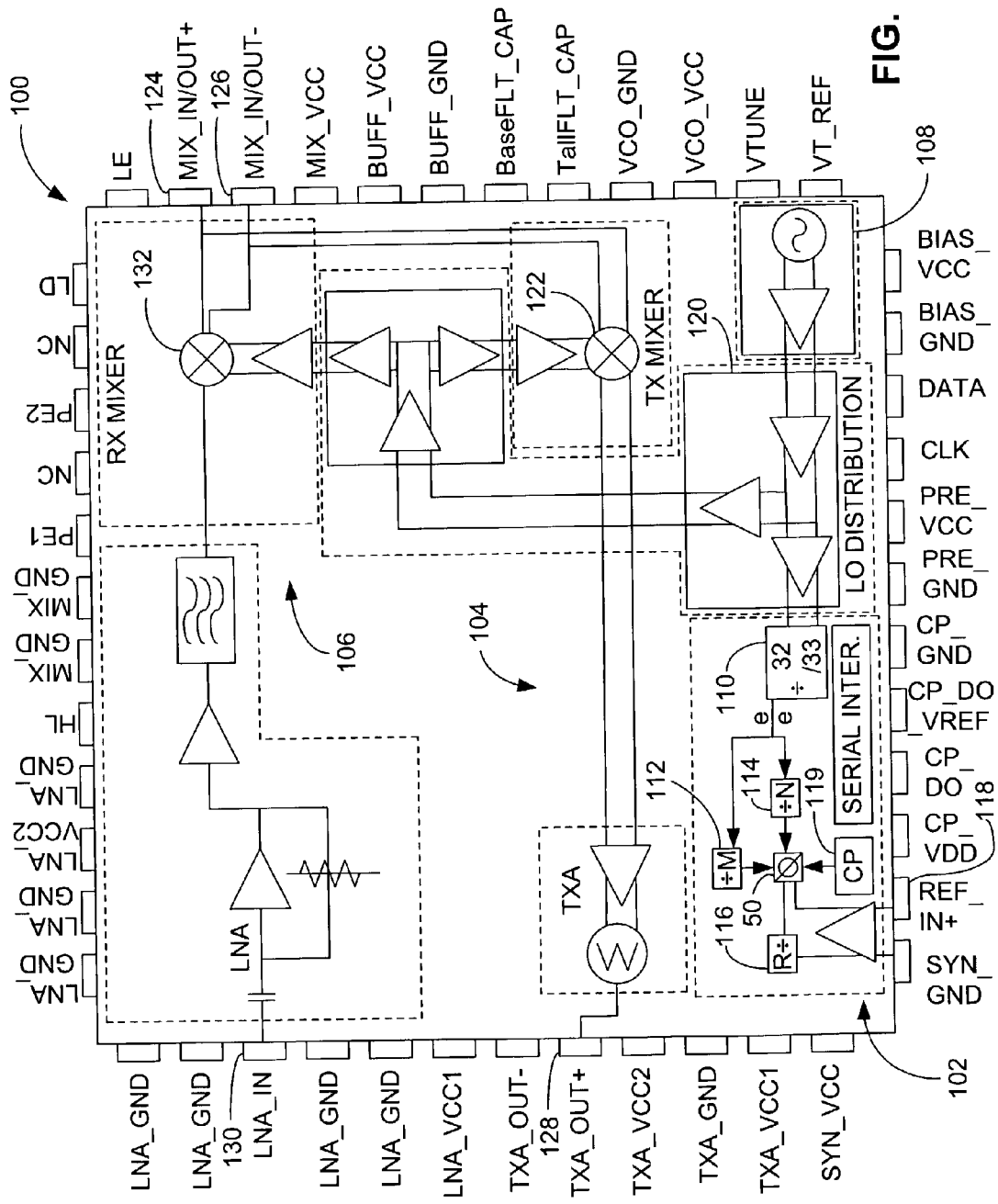
FIG. 10 is a Wireless-Area-Network (WAN) transmitter/receiver that can incorporate the phase detector of FIG. 5 according to an embodiment of the invention.

FIG. 10 is a Wireless-Area-Network (WAN) transmitter/receiver 100 that can incorporate the phase detector 50 of FIG. 5 according to an embodiment of the invention. The transmitter/receiver 100 includes a PLL 102, a transmitter 104, and a receiver 106. In addition to the phase detector 50, the PLL 102 includes a VCO 108 for generating a local oscillator (LO) signal, selectable frequency dividers 110, 112, and 114, a divider 116 for frequency dividing a reference signal received on a terminal 118, a charge pump 119, and an LO distributor 120 for distributing the LO signal to the transmitter 104 and receiver 106. The transmitter 104 includes a mixer 122 that modulates the LO with a differential baseband data signal received from a computer (not shown) via data terminals 124 and 126. The transmitter 104 then provides this modulated data signal to a transmit terminal 128 for wireless transmission to a remote receiver (not shown). Similarly, the receiver 106 receives a modulated data signal from a remote wireless transmitter (not shown) via a terminal 130, and includes a mixer 132 that demodulates the received data signal with the LO signal and provides a differential demodulated data signal to the computer via the terminals 124 and 126. As discussed above, the phase detector 50 reduces the phase error that the charge pump 119 introduces into LO, and thus causes less of a decrease in the SNRs of the modulated and demodulated data signals than a conventional phase detector. The transmitter/receiver also includes other circuits that are conventional, and that are thus omitted from FIG. 10 for brevity.

What is claimed is:

1. A phase detector, comprising:
a phase-detect circuit operable to receive a reference signal and an oscillator signal and to generate a phase-detect pulse having a first duration in response to one of the reference and oscillator signals; and
a phase-correction circuit coupled to the phase-detect circuit and operable to generate a phase-correction pulse having a second duration in response to the phase-detect pulse, the first duration being greater than the second duration.

2. The phase detector of claim 1, further comprising a reset circuit coupled to the phase-detect and phase-correction circuits and operable to disable the phase-detect and phase-correction circuits when the reference and oscillator signals have the same logic state.

3. A phase detector, comprising:
a phase-detect circuit operable to receive a reference signal and an oscillator signal and to generate respective first and second phase-detect pulses having first and second durations in response to the reference and oscillator signals, respectively; and
a phase-correction circuit coupled to the phase-detect circuit and operable to generate respective first and second phase-correction pulses having third and fourth durations in response to the first and second phase-detect signals, the first and second durations being greater than the third and fourth durations, respectively.

4. The phase detector of claim 3, further comprising a reset circuit coupled to the phase-detect and phase-correction circuits and operable to disable the phase-detect and phase-correction circuits when the phase-detect circuit simultaneously generates both the first and the second phase-detect pulse.

5. The phase detector of claim 3, further comprising:
a reset circuit coupled to the phase-detect circuit and operable to disable the phase-detect circuit when the reference and oscillator signals have the same logic state; and
wherein the phase-detect circuit comprises,
a first D flip-flop having a clock terminal operable to receive the reference signal, a reset terminal coupled to the reset circuit, and an output terminal coupled to the phase-correction and reset circuits and operable to provide the first phase-detect pulse, and
a second D flip-flop having a clock terminal operable to receive the oscillator signal, a reset terminal coupled to the reset circuit, and an output terminal coupled to the phase-correction and reset circuits and operable to provide the second phase-detect pulse.

6. The phase detector of claim 3, further comprising:
a reset circuit coupled to the phase-correction circuit and operable to generate a reset signal that disables the phase-correction circuit when the reference and oscillator signals have the same logic state; and
wherein the phase-correction circuit comprises,
a first delay circuit operable to receive and delay the first phase-detect pulse by a first delay time to generate a first intermediate pulse,
a second delay circuit operable to receive and delay the second phase-detect pulse by a second delay time that is equal or approximately equal to the first delay time to generate a second intermediate pulse,
a third delay circuit operable to receive and delay the reset signal by a third delay time to generate a delayed reset signal,
a first output gate coupled to the first and third delay circuits and operable to generate the first phase-correction pulse equal to the first intermediate pulse when the delayed reset signal has a non-reset state and to generate the first phase-correction pulse equal to an inactive state when the delayed reset signal has a reset state, and
a second output gate coupled to the second and third delay circuits and operable to generate the second phase-correction pulse equal to the second intermediate pulse when the delayed reset signal has the non-reset state and to generate the second phase-correction pulse equal to an inactive state when the delayed reset signal has the reset level.

7. The phase detector of claim 6 wherein the first and second delay times equal or approximately equal zero.

8. A phase detector, comprising:
a phase-detect circuit operable to receive a reference signal and an oscillator signal and to simultaneously generate first and second phase-detect pulses for a first time period in response to the reference and oscillator signals having the same logic state; and
a phase-correction circuit coupled to the phase-detect circuit and operable to simultaneously generate first and second phase-correction pulses for a second time period in response to the first and second phase-detect pulses, the second period being shorter than the first period.

9. The phase detector of claim 8, further comprising a reset circuit coupled to the phase-detect and phase-correction circuits, operable to cause the phase-detect circuit to stop generating the first and second phase-detect pulses after a feedback delay that is equal to the first time period, and operable to cause the phase-correction circuit to stop generating the first and second phase-correction pulses after a feed-forward delay that is equal to the second time period.

10. The phase detector of claim 8, further comprising:
a reset circuit coupled to the phase-detect circuit and operable to generate a reset signal a first time delay after the phase-detect circuit simultaneously generates the first and second phase-detect pulses; and
wherein the phase-detect circuit comprises,
a first D flip-flop having a clock terminal operable to receive the reference signal, a reset terminal operable to receive the reset signal, and an output terminal coupled to the phase-correction and reset circuits and operable to carry the first phase-detect pulse, the first flip-flop operable to stop generating the first phase-detect pulse a second time delay after receiving the reset signal, the sum of the first and second time delays equal or approximately equal to the first time period, and
a second D flip-flop having a clock terminal operable to receive the oscillator signal, a reset terminal operable to receive the reset signal, and an output terminal coupled to the phase-correction and reset circuits and operable to carry the second phase-detect signal, the second flip-flop operable to stop generating the second phase-detect signal a third time delay after receiving the reset signal, the sum of the first and third time delays equal or approximately equal to the first time period.

11. The phase detector of claim 8, further comprising:
a reset circuit coupled to the phase-correction circuit and operable to generate a reset signal a first time delay after the phase-detect circuit simultaneously generates the first and second phase-detect pulses; and
wherein the phase-correction circuit comprises,
a first delay circuit operable to receive and delay the first phase-detect pulse by a second time delay,
a second delay circuit operable to receive and delay the second phase-detect pulse by a third time delay that is equal or approximately equal to the second time delay,
a third delay circuit operable to receive and delay the reset signal by a fourth time delay,
a first output gate coupled to the first and third delay circuits, operable to generate the first phase-correction pulse equal to the delayed first phase-detect pulse, and operable to stop generating the first phase-correction pulse a fifth time delay after receiving the reset signal, the sum of the first, fourth, and fifth time delays minus the second time delay being equal or approximately equal to the second time period, and
a second output gate coupled to the second and third delay circuits, operable to generate the second phase-correction pulse equal to the delayed second phase-detect signal, and, operable to stop generating the second phase-correction pulse a sixth time delay after receiving the reset signal, the sum of the first, fourth, and sixth time delays minus the third time delay being equal or approximately equal to the second time period.

12. A phase detector, comprising:
a phase-detect circuit operable to receive a reference signal and an oscillator signal, to generate a first phase-detect pulse in response to the reference signal having a first logic state, to generate a second phase-detect pulse in response to the oscillator signal having the first logic state, and to stop generating the first and second phase-detect pulse a first time delay after the generation of the lagging one of the first and second phase-detect pulse; and
a phase-correction circuit coupled to the phase-detect circuit and operable to generate first and second phase-correction pulses in response to the first and second phase-detect pulses, respectively, and to stop generating the first and second phase-correction pulses a second time delay after the generation of the lagging one of the first and second phase-correction pulse, the second time delay being shorter than the first time delay.

13. The phase detector of claim 12, further comprising a reset circuit
coupled to the phase-detect and phase-correction circuits, operable to cause the phase-detect circuit to stop generating the first and second phase-detect pulses after a feedback-delay time that is equal to the first time delay, and operable to cause the phase-correction circuit to stop generating the first and second phase-correction pulses after a feed-forward delay that is equal to the second time delay.

14. The phase detector of claim 12, further comprising:
a reset circuit coupled to the phase-detect circuit and operable to generate a reset signal a third time delay after the generation of the lagging one of the first and second phase-detect pulses; and
wherein the phase-detect circuit comprises,
a first D flip-flop having a clock terminal operable to receive the reference signal, a reset terminal operable to receive the reset signal, and an output terminal coupled to the phase-correction and reset circuits and operable to carry the first phase-detect pulse, the first flip-flop operable to stop generating the first phase-detect pulse a fourth time delay after receiving the reset signal, the sum of the third and fourth time delays equal or approximately equal to the first time delay, and
a second D flip-flop having a clock terminal operable to receive the oscillator signal, a reset terminal operable to receive the reset signal, and an output terminal coupled to the phase-correction and reset circuits and operable to carry the second phase-detect pulse, the second flip-flop operable to stop generating the second phase-detect pulse a fifth time delay after receiving the reset signal, the sum of the third and fifth time delays equal or approximately equal to the first time delay.

15. The phase detector of claim 12, further comprising:
a reset circuit coupled to the phase-correction circuit and operable to generate a reset signal a third time delay after the generation of the lagging one of the first and second phase-detect pulses to be generated; and
wherein the phase-correction circuit comprises,
a first delay circuit operable to receive and delay the first phase-detect pulse by a fourth time delay,
a second delay circuit operable to receive and delay the second phase-detect pulse by a fifth time delay that is equal or approximately equal to the fourth time delay,
a third delay circuit operable to receive and delay the reset signal by a sixth time delay,
a first output gate coupled to the first and third delay circuits, operable to generate the first phase-correction pulse equal to the delayed first phase-detect pulse, and operable to stop generating the first phase-correction pulse a seventh time delay after receiving the reset signal, the sum of the third, fourth, and seventh time delays minus the sixth time delay being equal or approximately equal to the second time delay, and a second gate coupled to the second and third delay circuits, operable to generate the second phase-correction pulse equal to the delayed second phase-detect pulse, and operable to stop generating the second phase-correction pulse an eighth time delay after receiving the reset signal, the sum of the third, fifth, and eighth time delays minus the sixth time delay being equal or approximately equal to the second time delay.

16. A phase-locked loop, comprising:

an oscillator operable to receive a control signal and to generate an oscillator signal having a frequency that is related to the control signal; and a phase detector/control circuit coupled to the oscillator and operable to receive a reference signal and a feedback oscillator signal and to generate the control signal, the phase detector/control circuit comprising, a phase-detect circuit operable to generate a phase-detect pulse having a first duration in response to one of the reference and feedback signals, a phase-correction circuit coupled to the phase-detect circuit and operable to generate a phase-correction pulse having a second duration in response to the phase-detect pulse, the first duration being greater than the second duration, and a conversion circuit operable to generate the control signal from the phase-correction pulse.

17. The phase-locked loop of claim 16 wherein the conversion circuit comprises a filter that is operable to filter the phase-correction pulse to generate the control signal.

18. The phase-locked loop of claim 16 wherein the conversion circuit comprises a charge pump operable to integrate the phase-correction pulse to generate the control signal.

19. The phase-locked loop of claim 16, further comprising a frequency divider that is operable to generate the feedback signal having a lower frequency than the oscillator signal.

20. The phase-locked loop of claim 16 wherein the feedback oscillator signal equals the oscillator signal.

21. A transmitter/receiver, comprising:

a receiver circuit operable to generate a received base-band data signal from a modulated receive signal and a local-oscillator signal;

a transmitter circuit operable to generate a modulated transmission signal from a transmission base-band data signal and the local-oscillator signal; and a phase-locked loop coupled to the receiver and transmitter circuits and operable to receive a reference signal and to generate the local-oscillator signal having a frequency that is related to the frequency of the reference signal, the phase-locked loop comprising, an oscillator operable to receive a control signal and to generate the local-oscillator signal having a frequency that is related to the control signal, and a phase-detector/control circuit coupled to the oscillator and operable to receive a feedback oscillator signal and to generate the control signal, the phase detector/control circuit comprising, a phase-detect circuit operable to generate a phase-detect pulse having a first duration in response to the reference and feedback oscillator signals, a phase-correction circuit coupled to the phase-detect circuit and operable to generate a phase-correction pulse having a second duration in response to the phase-detect pulse, the first duration being greater than the second duration, and a conversion circuit operable to generate the control signal from the phase-correction pulse.

22. A method, comprising:

generating a phase-detect pulse having a first duration in response to a reference signal and an oscillator signal having a frequency;

generating a phase-correction pulse having a second duration in response to the phase-detect pulse, the first duration being greater than the second duration; and controlling the frequency of the oscillator signal with the phase-correction pulse.

23. The method of claim 22 wherein generating the phase-detect pulse comprises generating the phase-detect pulse while the reference and oscillator signals have different logic states and for a time after the reference and oscillator signals attain the same logic state.

24. A method, comprising:

generating respective first and second phase-detect pulses having first and second durations, respectively, in response to the logic states of a reference signal and an oscillator signal;

generating respective first and second phase-correction pulses having third and fourth durations, respectively, in response to the first and second phase-detect pulses, the first and second durations being greater than the third and fourth durations, respectively; and controlling a frequency of the oscillator signal with the first and second phase-correction pulses.

25. The method of claim 24 wherein generating the first and second phase-detect pulses comprises generating the phase-detect signals while the reference and oscillator signals have different logic states and for a time after the reference and oscillator signals attain the same logic state.

26. The method of claim 24 wherein generating the first and second phase-correction pulses comprises:

generating the first phase-correction pulses a first time delay after generating the first phase-detect pulse;

generating the second phase-correction pulse a second time delay after generating the second phase-detect pulse, the second time delay equal or approximately equal to the first time delay; and ending the first and second phase-correction pulses a third time delay after the lagging one of the first and second phase-detect pulses, the third time delay greater than the first and second time delays.

27. A method, comprising:

simultaneously generating first and second phase-detect pulses for a first time period in response to a reference signal and an oscillator signal having the same logic state;

simultaneously generating first and second phase-correction pulses for a second time period in response to the first and second phase-detect pulses, the second time period being less than the first time period; and controlling a frequency of the oscillator signal with the first and second phase-correction pulses.

28. The method of claim 27, further comprising:

ending the first and second phase-detect pulses after a feedback delay that is equal to the first time period; and ending the first and second phase-correction pulses after a feed-forward delay that is equal to the second time period.

29. A method, comprising:
generating a first phase-detect pulse in response to one of a reference signal and an oscillator signal having a first logic state;
generating a second phase-detect pulse in response to the other of the reference signal and the oscillator signal having the first logic state;
ending the first phase-detect pulse a first time delay after generating the second phase-detect pulse;
ending the second phase-detect pulse a second time delay after generating the second phase-detect pulse;
generating a first phase-correction pulse a third time delay after generating the first phase-detect pulse;
generating a second phase-correction pulse a fourth time delay after generating the second phase-detect pulse;
ending the first phase-correction pulse a fifth time delay after generating the second phase-correction pulse;
ending the second phase-correction pulse a sixth time delay after generating the second phase-correction pulse; and
controlling a frequency of the oscillator signal with the first and second phase-correction pulses.

30. The method of claim 29 wherein:
the second time delay equals or approximately equals the first time delay; and
the fourth time delay equals or approximately equals the third time delay.

31. The method of claim 29 wherein:
the first time delay is greater than both the fifth and sixth time delays; and
the second time delay is greater than the both the fifth and sixth time delays.

32. The method of claim 29 wherein generating the second phase-detect pulse comprises generating the second phase-detect pulse a seventh time delay after generating the first phase-detect pulse.

* * * * *